US012651036B2

(12) United States Patent
Yu et al.

(10) Patent No.: US 12,651,036 B2
(45) Date of Patent: Jun. 9, 2026

(54) METHOD AND APPARATUS FOR RECONSTRUCTING ATOMIC SPATIAL DISTRIBUTION AND ELECTRON BEAM FUNCTION

(71) Applicant: TSINGHUA UNIVERSITY, Beijing (CN)

(72) Inventors: Rong Yu, Beijing (CN); Wenfeng Yang, Beijing (CN); Haozhi Sha, Beijing (CN); Jizhe Cui, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 458 days.

(21) Appl. No.: 18/306,985

(22) Filed: Apr. 25, 2023

(65) Prior Publication Data

US 2023/0317409 A1 Oct. 5, 2023

Related U.S. Application Data

(63) Continuation of application No. PCT/CN2022/076181, filed on Feb. 14, 2022.

(30) Foreign Application Priority Data

Jan. 30, 2022 (CN) .......................... 202210113941.0

(51) Int. Cl.
*G06F 17/15* (2006.01)
*H01J 37/22* (2006.01)

(52) U.S. Cl.
CPC ............ *G06F 17/15* (2013.01); *H01J 37/222* (2013.01); *H01J 2237/223* (2013.01); *H01J 2237/2802* (2013.01)

(58) Field of Classification Search
CPC ... G06F 17/15; H01J 37/222; H01J 2237/223; H01J 2237/2802
See application file for complete search history.

(56) References Cited

U.S. PATENT DOCUMENTS

2014/0131574 A1* 5/2014 Zewail .................. H01J 37/073
250/311
2018/0294136 A1* 10/2018 Kaminer ............... H01J 37/263
(Continued)

FOREIGN PATENT DOCUMENTS

CN 111179371 A 5/2020
CN 113052239 A 6/2021
(Continued)

OTHER PUBLICATIONS

International Search Report dated Aug. 29, 2022 in International Application No. PCT/CN2022/076181.

*Primary Examiner* — Ross Varndell
*Assistant Examiner* — Rachel L Roberts

(57) ABSTRACT

The present disclosure discloses a method, which includes: obtaining, by controlling to move an electron beam to scan a sample, a diffraction intensity of the sample at each scanning position; initializing a sample transmission function and an electron beam function, establishing, based on the diffraction intensity, the sample transmission function, and the electron beam function, a forward propagation model containing to-be-optimized parameters, and calculating a value of a loss function; solving a derivative of the loss function with respect to the to-be-optimized parameters, to obtain gradients of the to-be-optimized parameters in the sample transmission function and the electron beam function, optimizing the to-be-optimized parameters based on the gradients, and updating the value of the loss function; and repeating an iteration process until an iteration termination condition is satisfied, and outputting an optimized sample transmission function and an optimized electron beam function.

12 Claims, 6 Drawing Sheets

(56)                    References Cited

U.S. PATENT DOCUMENTS

2021/0125041  A1 *    4/2021   Mills ..................... G06F 7/5443
2021/0357740  A1     11/2021   He et al.

FOREIGN PATENT DOCUMENTS

CN          113706411  A     11/2021
CN          113720865  A     11/2021
WO      WO-2021030297  A1 *   2/2021   ............ H01J 37/222

* cited by examiner

Obtaining, by controlling to move an electron beam to scan a sample, a diffraction intensity of the sample at each scanning position — S101

Constructing a sample transmission function and an electron beam function, establishing, based on the diffraction intensity, the sample transmission function, and the electron beam function, a forward propagation model containing to-be-optimized parameters, and calculating a value of a loss function — S102

Solving a derivative of the loss function with respect to the to-be-optimized parameters, to obtain gradients of the to-be-optimized parameters in the sample transmission function and the electron beam function, optimizing the to-be-optimized parameters based on the gradients, and updating the value of the loss function — S103

Determining whether a current iteration satisfies an iteration termination condition, performing S103 in response to the current iteration failing to satisfy the iteration termination condition, and outputting, in response to the current iteration satisfying the iteration termination condition, an optimized sample transmission function and an optimized electron beam function — S104

FIG. 1

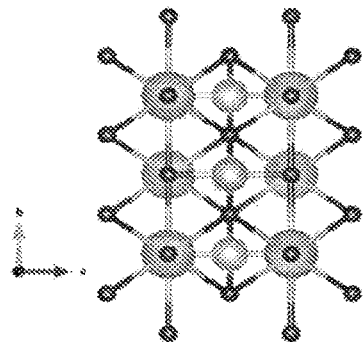

FIG. 2

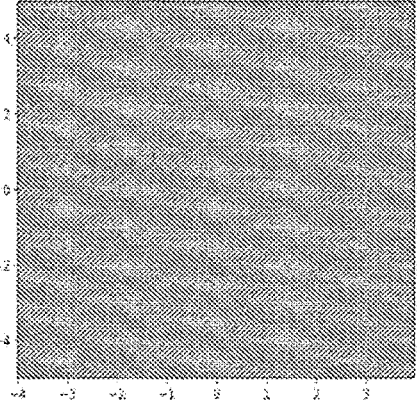

FIG. 3

METHOD AND APPARATUS FOR RECONSTRUCTING ATOMIC SPATIAL DISTRIBUTION AND ELECTRON BEAM FUNCTION

CROSS-REFERENCE TO RELATED APPLICATION

This application a continuation of International Application No. PCT/CN2022/076181 filed on Feb. 14, 2022, which claims priority to Chinese Patent Application No. 202210113941.0, entitled "METHOD AND APPARATUS FOR RECONSTRUCTING ATOMIC SPATIAL DISTRIBUTION AND ELECTRON BEAM FUNCTION", and filed on Jan. 30, 2022 by Tsinghua University.

FIELD

The present disclosure relates to the field of imaging technologies, and more particularly, to a method and apparatus for reconstructing an atomic spatial distribution and an electron beam function.

BACKGROUND

Conventional electron microscopy imaging methods play an important role in characterizing microstructures of materials. Existing ptychographic imaging methods can obtain information on an electron beam function, an amplitude and a phase of a sample, etc. However, only two-dimensional image can be obtained by these imaging methods, while precise parametrical information such as atom positions, orbital occupation, aberration coefficients etc., cannot be directly obtained.

SUMMARY

The present disclosure provides a method and apparatus for reconstructing an atomic spatial distribution as a collection of local orbitals and an electron beam function, an electronic device, and a storage medium.

According to embodiments in a first aspect of the present disclosure, a method for reconstructing an atomic spatial distribution and an electron beam function is provided. The method includes: S101, obtaining, by controlling to move an electron beam to scan a sample, a diffraction intensity of the sample at each scanning position; S102, constructing a sample transmission function and an electron beam function, establishing, based on the diffraction intensity, the sample transmission function, and the electron beam function, a forward propagation model containing to-be-optimized parameters, and calculating a value of a loss function; S103, solving a derivative of the loss function with respect to the to-be-optimized parameters, to obtain gradients of the to-be-optimized parameters in the sample transmission function and the electron beam function, optimizing the to-be-optimized parameters based on the gradients, and updating the value of the loss function; and S104, determining whether a current iteration satisfies an iteration termination condition, performing S103 in response to the current iteration failing to satisfy the iteration termination condition, and outputting, in response to the current iteration satisfying the iteration termination condition, an optimized sample transmission function and an optimized electron beam function.

Optionally, in an embodiment of the present disclosure, the action of constructing the sample transmission function and the electron beam function includes: describing the sample transmission function using local functions for the atomic spatial distribution; and describing the electron beam function using aberration functions.

Optionally, in an embodiment of the present disclosure, the method further includes, prior to the action of constructing the sample transmission function and the electron beam function: initializing the to-be-optimized parameters in the sample transmission function and the electron beam function. The to-be-optimized parameters in the electron beam function includes aberration coefficients. The to-be-optimized parameters in the sample transmission function include atom positions and parameters describing the atomic spatial distribution.

Optionally, in an embodiment of the present disclosure, the loss function is:

$$\mathcal{L} = \frac{1}{2}\sum_j \sum_{u,v} \left( |\mathcal{F}\{\psi_{exit}\}|^2 - I_j \right)^2,$$

where $j$ represents an ordinal number of the scanning position, $u$, $v$ re resents coordinates in real space, $|\cdot|$ represents calculating a modulus of each element in a matrix, $\mathcal{F}\{\cdot\}$ represents calculating a two-dimensional Fourier transform of a matrix, $I_j$ represents the diffraction intensity, and $\psi_{exit}$ represents an exit wave function;

the exit wave function $\psi_{exit}$ is:

$$\Psi_{exit} = \mathcal{P}_{dz}\{ \ldots \mathcal{P}_{dz}\{\mathcal{P}_{dz}\{P(r-r_j)O_1(r)\}O_2(r)\}O_3(r) \ldots \}O_l(r),$$

where $P(r)$ represents the electron beam function, $P(r-r_j)$ represents the electron beam scanning to a j-th position, $\mathcal{P}_{dz}\{\cdot\}$ represents a Fresnel diffraction propagator, and $O_l(r)$ represents the sample transmission function of the l-th slice;

the sample transmission function $O_l(r)$ is:

$$O_l(r) = \mathrm{Amp}_l(r) * e^{i\sigma V_l(r)},$$

where $V_l(r)$ represents a projection potential of the transmission function, $\mathrm{Amp}_l(r)$ represents an amplitude of the transmission function, $$V_1(r) = s_1(r) + p_1(r) + d_1(r) + f_1(r) + \ldots , \text{ and}$$

$$\mathrm{Amp}_1(r) = \sum_i A2_{l,i} * \exp\left\{ -\frac{\left[ (M_{l,i} - y)^2 + (N_{l,i} - x)^2 \right]}{B2_{l,i}} \right\} + D_1,$$

where $s(r)$ represents an s-orbital spatial distribution of electrons in the l-th slice, $p(r)$ represents a p-orbital spatial distribution of electrons in the l-th slice, and $s_l(r)$ is represented by a local function of a Gaussian function as:

$$s_1(r) = \sum_i A1_{l,i} * \exp\left\{ -\frac{\left[ (M_{l,i} - y)^2 + (N_{l,i} - x)^2 \right]}{B1_{l,i}} \right\};$$

and the electron beam function $P(r)$ is:

$$P(r) = \mathcal{F}\{A(k)e^{i\chi(k)}\},$$

$$\chi(k) = R\left\{\frac{1}{2}\omega\bar{\omega}C_{1,0} + \frac{1}{2}\bar{\omega}^2C_{1,2} + \omega^2\bar{\omega}^2C_{2,1} + \frac{1}{4}\omega^2\bar{\omega}^2C_{3,0} + \dots \right\},$$

where A(k) represents a diaphragm function, $C_{n,m}$ represents an aberration coefficient, $\chi(k)$ represents an aberration function, R{•} represents taking a real part of a matrix in {•}, aberration $\omega = k_x + i*k_y$, $k_x$ and $k_y$ are coordinates in reciprocal space, respectively, and $\bar{\omega}$ is the complex conjugate matriz of $\omega$.

Optionally, in an embodiment of the present disclosure, the iteration termination condition includes: a number of iterations reaching a predetermined threshold; and/or the loss function converging to a predetermined value.

According to embodiments in a second aspect of the present disclosure, an apparatus for reconstructing an atomic spatial distribution and an electron beam function is provided. The apparatus includes: an obtaining module configured to obtain, by controlling to move an electron beam to scan a sample, a diffraction intensity of the sample at each scanning position; a construction module configured to construct a sample transmission function and an electron beam function, establish, based on the diffraction intensity, the sample transmission function, and the electron beam function, a forward propagation model containing to-be-optimized parameters, and calculate a value of a loss function; and an optimization module configured to solve a derivative of the loss function with respect to the to-be-optimized parameters, to obtain gradients of the to-be-optimized parameters in the sample transmission function and the electron beam function, optimize the to-be-optimized parameters based on the gradients, update the value of the loss function, repeat an iteration process until an iteration termination condition is satisfied, and output an optimized sample transmission function and an optimized electron beam function.

Optionally, in an embodiment of the present disclosure, the action of constructing the sample transmission function and the electron beam function includes: describing the sample transmission function using local functions for the atomic spatial distribution; and describing the electron beam function using aberration functions.

Optionally, in an embodiment of the present disclosure, the apparatus further includes: an initialization module configured to, prior to the action of constructing the sample transmission function and the electron beam function, initialize the to-be-optimized parameters in the sample transmission function and the electron beam function. The to-be-optimized parameters in the electron beam function includes the aberration coefficients. The to-be-optimized parameters in the sample transmission function include atom positions and parameters describing the atomic spatial distribution.

Optionally, in an embodiment of the present disclosure, the loss function is:

$$\mathcal{L} = \frac{1}{2}\sum_{j}\sum_{u,v}\left(|\mathcal{F}\{\psi_{exit}\}|^2 - I_j\right)^2,$$

where j represents an ordinal number of the scanning position, u, v represents coordinates in real space, |•| represents calculating a modulus of each element in a matrix, $\mathcal{F}\{•\}$ represents calculating a two-dimensional Fourier transform of a matrix, $I_j$ represents the diffraction intensity, and $\psi_{exit}$ represents an exit wave function;

the exit wave function $\psi_{exit}$ is:

$$\psi_{exit} = \mathcal{P}_{dz}\{\dots\mathcal{P}_{dz}\}\{\mathcal{P}_{dz}\{P(r-r_j)O_1(r)\}O_2(r)\}O_3(r)\dots \}O_1(r),$$

where P(r) represents the electron beam function, $P(r-r_j)$ represents the electron beam scanning to a j-th position, $\mathcal{P}_{dz}\{•\}$ represents a Fresnel diffraction propagator, and $O_l(r)$ represents the sample transmission function of the l-th slice;

the sample transmission function $O_l(r)$ is:

$$O_l(r) = \text{Amp}_l(r) * e^{i\sigma V_l(r)},$$

where $V_l(r)$ represents a projection potential of the transmission function, $\text{Amp}_l(r)$ represents an amplitude of the transmission function, $$V_l(r) = s_l(r) + p_l(r) + d_l(r) + f_l(r) + \dots, \text{ and}$$

$$\text{Amp}_l(r) = \sum_i A2_{l,i} * \exp\left\{\frac{[(M_{l,i}-y)^2 + (N_{l,i}-x)^2]}{B2_{l,i}}\right\} + D_l,$$

where s(r) represents an s-orbital spatial distribution of electrons in the l-th slice, p(r) represents a p-orbital spatial distribution of electrons in the l-th slice, and $s_l(r)$ is represented by a local function of a Gaussian function as:

$$s_1(r) = \sum_i A1_{l,i} * \exp\left\{-\frac{[(M_{l,i}-y)^2 + (N_{l,i}-x)^2]}{B1_{l,i}}\right\};$$

the electron beam function P(r) is:

$$P(r) = \mathcal{F}\{A(k)e^{i\chi(k)}\},$$

$$\chi(k) = R\left\{\frac{1}{2}\omega\bar{\omega}C_{1,0} + \frac{1}{2}\bar{\omega}^2C_{1,2} + \omega^2\bar{\omega}^2C_{2,1} + \frac{1}{4}\omega^2\bar{\omega}^2C_{3,0} + \dots \right\},$$

where A(k) represents a diaphragm function, $C_{n,m}$ represents an aberration coefficient, $\chi(k)$ represents an aberration function, R{•} represents taking a real part of a matrix in {•}, aberration $\omega = k_x + i*k_y$, $k_x$ and $k_y$ are coordinates in reciprocal space, respectively, and $\bar{\omega}$ is the complex conjugate matrix of $\omega$.

Optionally, in an embodiment of the present disclosure, the iteration termination condition includes: a number of iterations reaching a predetermined threshold; and/or the loss function converging to a predetermined value.

According to embodiments in a third aspect of the present disclosure, an electronic device is provided. The electronic device includes: a memory; a processor; and a computer program stored in the memory and executable on the processor. The processor, when executing the computer program, performs the method for reconstructing the atomic spatial distribution and the electron beam function according to any of the above embodiments.

According to embodiments in a fourth aspect of the present disclosure, a computer-readable storage medium is provided. The computer-readable storage medium has a computer program stored thereon. The computer program, when executed by a processor, performs the method for reconstructing the atomic spatial distribution and the electron beam function according to any of the above embodiments.

With the method and apparatus for reconstructing the atomic spatial distribution and the electron beam function according to the embodiments of the present disclosure, a representation of the electron beam function by a function obtained from a calculation of, but not limited to, the aberration coefficients breaks a limitation of conventional ptychographic imaging algorithms that operate directly on pixels in a space where the electron beam function is located, making an optimized electron beam function closer to a real electron beam. In addition, a representation of the transmission function by, but not limited to, local functions of the atomic spatial distribution breaks a limitation of ptychographic imaging algorithms to directly obtain position information of atoms in a sample.

Additional aspects and advantages of the present disclosure will be provided at least in part in the following description, or will become apparent at least in part from the following description, or can be learned from practicing of the present disclosure.

BRIEF DESCRIPTION OF THE DRAWINGS

The above and/or additional aspects and advantages of the resent disclosure will become more apparent and more understandable from the following description of embodiments taken in conjunction with the accompanying drawings.

FIG. 1 is a flowchart illustrating a method for reconstructing an atomic spatial distribution and an electron beam function according to an embodiment of the present disclosure.

FIG. 2 is a schematic structural diagram showing a projection of a sample of strontium titanate used in Example 1 along a direction [001] according to an embodiment of the present disclosure.

FIG. 3 is a schematic diagram showing a distribution of scanning points for an electron beam according to an embodiment of the present disclosure.

DETAILED DESCRIPTION

Figure 4:
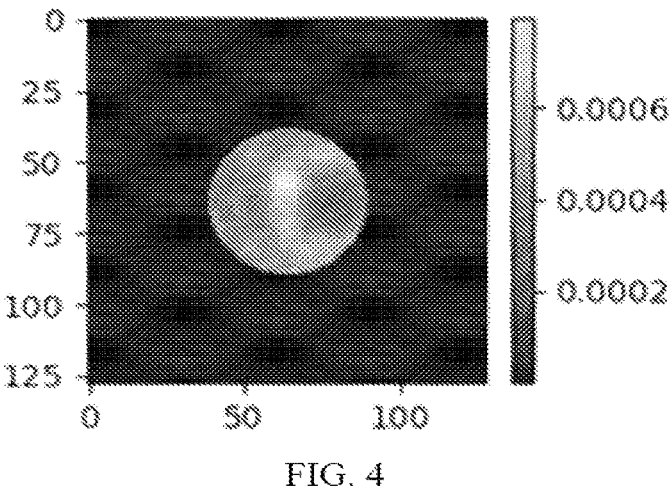
FIG. 4 is a schematic diagram showing a diffraction pattern at the 1,000-th scanning position according to an embodiment of the present disclosure.

The embodiments of the present disclosure will be described in detail below with reference to examples thereof as illustrated in the accompanying drawings, throughout which same or similar elements, or elements having same or similar functions, are denoted by same or similar reference numerals. The embodiments described below with reference to the drawings are illustrative only, and are intended to explain, rather than limiting, the present disclosure.

A method and apparatus for reconstructing an atomic spatial distribution and an electron beam function, an electronic device, and a storage medium according to embodiments of the present disclosure will be described below with reference to the accompanying drawings. For problems mentioned above in BACKGROUND of an inability to parametrically represent atom positions, orbital occupation, aberration coefficients, etc., the present disclosure provides a method for reconstructing an atomic spatial distribution and an electron beam function. In the method, an electron beam function is represented by, but not limited to, aberration functions corresponding to aberration coefficients, and a transmission function is represented by, but not limited to, a parametrical form of local functions of an atomic spatial distribution, allowing resolution with sub-pixel precision to be achieved. In addition, the information on atom positions and the atomic spatial distribution is represented parametrically while advantages of conventional ptychographic imaging are retained. Therefore, a problem in the related art that only two-dimensional image of a sample can be obtained but parameterized representations of atom positions, orbital occupation, aberration coefficients, etc., are impossible is solved.

FIG. 1 is a flowchart illustrating a method for reconstructing an atomic spatial distribution and an electron beam function according to an embodiment of the present disclosure.

As illustrated in FIG. 1, the method for reconstructing the atomic spatial distribution and the electron beam function may include the following actions at blocks S101 to S104.

At block S101, a diffraction intensity of a sample at each scanning position is obtained by controlling to move an electron beam to scan the sample.

In a further embodiment, the sample is scanned periodically or aperiodicity by moving the electron beam. Diffraction intensity data generated when the electron beam is located at each scanning position is collected. A diffraction intensity is obtained from the diffraction intensity data.

At block S102, a sample transmission function and an electron beam function are constructed, a forward propagation model containing to-be-optimized parameters is established based on the diffraction intensity, the sample transmission function, and the electron beam function, and a value of a loss function is calculated.

In embodiments of the present disclosure, the sample transmission function is described using a function including, but not limited to, local functions for the atomic spatial distribution, and the electron beam function is described using a function including, but not limited to, aberration functions. The loss function is obtained based on a constructed sample transmission function and a constructed electron beam function, in such a manner that a ptychographic reconstruction problem is changed into an optimization problem.

Optionally, in an embodiment of the present disclosure the method further includes, prior to the action of constructing the sample transmission function and the electron beam function: initializing the to-be-optimized parameters in the sample transmission function and the electron beam function. The to-be-optimized parameters in the electron beam function includes the aberration coefficients. The to-be-optimized parameters in the sample transmission function include atom positions and parameters describing the atomic spatial distribution.

Before construction of the sample transmission function and the electron beam function, parameters in the sample transmission function and the elect on beam function are initialized. Initialized parameters include aberration coefficients, atom positions, an s-orbital peak width, an s-orbital peak height, an amplitude peak width, an amplitude peak height, and other parameters describing the atomic spatial distribution. The electron beam function is obtained based on the aberration coefficients. The transmission function is obtained based on parameters such as the atom positions, the s-orbital peak width, the s-orbital peak height, the amplitude peak width, the amplitude peak height, and other parameters describing the atomic spatial distribution. A loss function L is then calculated.

Optionally, in an embodiment of the present disclosure, the loss function is expressed as a function with respect to the sample transmission function, the electron beam function, etc. The loss function includes, but is not limited to, a form of:

$$\mathcal{L} = \frac{1}{2}\sum_{j}\sum_{u,v}\left(|\mathcal{F}\{\psi_{exit}\}|^2 - I_j\right)^2,$$

where j represents an ordinal number of the scanning position, u, v represents coordinates in real space, represents calculating a modulus of each element in a matrix, $\mathcal{F}\{\bullet\}$ represents calculating a two-dimensional Fourier transform of a matrix, $I_j$ represents the diffraction intensity, and $\psi_{exit}$ represents an exit wave function.

In an embodiment of the present disclosure, the exit wave function $\psi_{exit}$ is a function related to the sample transmission function and the electron beam function. The exit wave function $\psi_{exit}$ is in a form of:

$$\psi_{exit} = \mathcal{P}_{dz}\{\dots \mathcal{P}_{dz}\{\mathcal{P}_{dz}\{P(r-r_j)O_1(r)\}O_2(r)\}O_3(r)\dots\}O_l(r).$$

The electron beam function obtained based on the aberration coefficients is shown below:

$$P(r) = \mathcal{F}\{A(k)e^{j\chi(k)}\},$$

where $P(r-r_j)$ represents the electron beam scanning to a j-th position. $P(r-r_j)$ can be obtained by a variety of methods including, but not limited to, the following method: using a diaphragm function $A(k)$ and an aberration function $\chi(k)$ corresponding to a given aberration coefficient $C_{n,m}$. The aberration function $\chi(k)$ is obtained through the following equation:

$$\chi(k) = R\left\{\frac{1}{2}\omega\bar{\omega}C_{1,0} + \frac{1}{2}\bar{\omega}^2C_{1,2} + \omega^2\bar{\omega}^2C_{2,1} + \frac{1}{4}\omega^2\bar{\omega}^2C_{3,0} + \dots\right\},$$

where $R\{\bullet\}$ represents taking a real part of a matrix in $\{\bullet\}$, the matrix in $\{\bullet\}$ represents other aberration coefficients, aberration $\omega = k_x + i*k_y$, $k_x$ and $k_y$ are coordinates in reciprocal space, respectively, and $\bar{\omega}$ is the complex conjugate matrix of $\omega$.

The transmission function $O_l(r)$ of the l-th slice obtained based on the parameters such as the atom positions, the s-orbital peak width, the s-orbital peak height, the amplitude peak width, the amplitude peak height, and other parameters describing the atomic spatial distribution is shown below:

$$O_l(r) = \mathrm{Amp}_l(r) * e^{i\sigma V_l(r)},$$

where $V_l(r)$ and $\mathrm{Amp}_l(r)$ represent a projection potential and an amplitude of the transmission function, respectively. $V_l(r)$ and $\mathrm{Amp}_l(r)$ may be described by expressions including but not limited to:

$$V_l(r) = s_l(r) + p_l(r) + d_l(r) + f_l(r) + \dots , \text{ and}$$

$$\mathrm{Amp}_l(r) = \sum_i A2_{l,i} * \exp\left\{-\frac{[(M_{l,i}-y)^2 + (N_{l,i}-x)^2]}{B2_{l,i}}\right\} + D_l,$$

where s(r) represents an s-orbital spatial distribution of electrons in the l-th slice, p(r) represents a p-orbital spatial distribution of electrons in the l-th slice and so on. A further description is made by an example of reconstructing the s-orbital spatial distribution of the electrons. It is clear that the example of the transmission function described in terms of reconstructing the s-orbital spatial distribution of the electrons is only part of the present disclosure. $s_l(r)$ may be described, but is not limited to being described, by a local function of a Gaussian function:

$$s_l(r) = \sum_i A1_{l,i} * \exp\left\{-\frac{[(M_{l,i}-y)^2 + (N_{l,i}-x)^2]}{B1_{l,i}}\right\}$$

The transmission function of each slice may be assumed to have a same thickness. $\mathcal{P}_{dz}\{\cdot\}$ represents a Fresnel diffraction or other actions. $p(k;dz)$ represents a Fresnel diffraction propagator or other propagators. The Fresnel diffraction may be expressed as:

$$\mathcal{P}_{dz}\{\cdot\} = \mathcal{F}^{-1}\{\mathcal{F}\{\cdot\}(k)p(k;dz)\}, \text{ and}$$

$$p(k;dz) = \exp(-i\pi dz\lambda k^2),$$

where $dz$ represents a thickness of each slice of the sample.

At block S103, a derivative of the loss function with respect to the to-be-optimized parameters is solved to obtain gradients of the to-be-optimized parameters in the sample transmission function and the electron beam function, the to-be-optimized parameters are optimized based on the gradients, and the value of the loss function is updated.

At block S104, whether a current iteration satisfies an iteration termination condition is determined, S103 is performed in response to the current iteration failing to satisfy the iteration termination condition, and an optimized sample transmission function and an optimized electron beam function are outputted in response to the current iteration satisfying the iteration termination condition.

After the loss function has been constructed by the above processes, parameters in the loss function are considered as to-be-optimized parameters. Gradients of the to-be-optimized parameters are obtained by deriving the loss function to iteratively optimize corresponding parameters.

It should be understood that gradients of the loss function $\mathcal{L}$ with respect to the aberration coefficients, the atom positions, the s-orbital peak width, the s-orbital peak height, the amplitude peak width, the amplitude peak height, other parameters describing the atomic spatial distribution, etc., are solved. Corresponding parameters are updated using the calculated gradients.

In a further embodiment, $(M_{I,i}, N_{I,i}, A1_{I,i}, B1_{I,i}, A2_{I,i}, B1_{I,i}, C_{n,m}, D_l)$ are considered as to-be-optimized parameters. Gradients of the loss function $\mathcal{L}$ with respect to parameters $\mathcal{L}$ such as $(M_{I,i}, N_{I,i}, A1_{I,i}, B1_{I,i}, A2_{I,i}, B1_{I,i}, C_{n,m}, D_i)$ are solved to iteratively optimize corresponding parameters.

The gradients may be obtained from the following analytical expressions (an example is given by solving partial derivatives of $\mathcal{L}$ with respect to the atomic spatial distribution and the amplitude of the transmission function of a single slice):

$$\frac{\partial \mathcal{L}}{\partial M_i} = \sum_j \sum_{u,v} \left(|\mathcal{F}\{\psi_{exit,j}\}|^2 - I_j\right) \cdot 2\mathbb{R}\left[\mathcal{F}\{\psi_{exit,j}\}^* \cdot \frac{\partial(\mathcal{F}\{\psi_{exit,j}\})}{\partial M_i}\right].$$

$$\frac{\partial(\mathcal{F}\{\psi_{exit,j}\})}{\partial M_i}$$

may be obtained from the following analytical expression:

$$\frac{\partial(\mathcal{F}\{\psi_{exit,j}\})}{\partial M_i} = \mathcal{F}\left\{\psi_{exit,j} \cdot i\sigma \frac{\partial V(r)}{\partial M_i} + \frac{\psi_{exit,j}}{Amp(r)} \frac{\partial Amp(r)}{\partial M_i}\right\} - 2\pi ik \cdot \mathcal{F}\{\psi_{exit,j}\},$$

where $V(r)$ and $Amp(r)$ are even functions. $Amp(r)$ is a real function. Partial derivatives of $V(r)$ and $Amp(r)$ with respect to different parameters are:

$$\frac{\partial V(r)}{\partial M_i} = -A1_i \cdot \exp\left[-\frac{[(M_{I,i}-y)^2 + (N_{I,i}-x)^2 1]}{B1_i}\right] \cdot \frac{2(M_{I,i}-y)}{B1_i},$$

$$\frac{\partial V(r)}{\partial N_i} = -A1_i \cdot \exp\left[-\frac{[(M_{I,i}-y)^2 + (N_{I,i}-x)^2]}{B1_i}\right] \cdot \frac{2(M_{I,i}-y)}{B1_i},$$

$$\frac{\partial V(r)}{\partial A1_i} = \exp\left[-\frac{[(M_{I,i}-y)^2 + (N_{I,i}-x)^2]}{B1_i}\right],$$

$$\frac{\partial V(r)}{\partial B1_i} = A1_i \cdot \exp\left[-\frac{[(M_{I,i}-y)^2 + (N_{I,i}-x)^2]}{B1_i}\right] \cdot \frac{(M_{I,i}-y)^2 + (N_{I,i}-x)^2}{B1_i^2},$$

$$\frac{\partial Amp(r)}{\partial M_i} = -A2_i \cdot \exp\left[-\frac{[(M_{I,i}-y)^2 + (N_{I,i}-x)^2]}{B2_i}\right] \cdot \frac{2(M_{I,i}-y)}{B2_i},$$

$$\frac{\partial Amp(r)}{\partial N_i} = -A2_i \cdot \exp\left[-\frac{[(M_{I,i}-y)^2 + (N_{I,i}-x)^2]}{B2_i}\right] \cdot \frac{2(M_{I,i}-y)}{B2_i},$$

$$\frac{\partial V(r)}{\partial A2_i} = \exp\left[-\frac{[(M_{I,i}-y)^2 + (N_{I,i}-x)^2]}{B2_i}\right],$$

$$\frac{\partial Amp(r)}{\partial B2_i} = A2_i \cdot \exp\left[-\frac{[(M_{I,i}-y)^2 + (N_{I,i}-x)^2]}{B2_i}\right] \cdot \frac{(M_{I,i}-y)^2 + (N_{I,i}-x)^2}{B2_i^2},$$

and $$\frac{\partial Amp(r)}{\partial D} = 1.$$

The obtained partial derivatives of $V(r)$ and $Amp(r)$ with respect to different parameters are substituted into the expression $$\frac{\partial \mathcal{L}}{\partial M_i}$$

to obtain the partial derivative of $\mathcal{L}$ with respect to each parameter.

Further, after the gradient of each to-be-optimized parameter is obtained through the loss function, the to-be-optimized parameter is updated based on the gradient. Each to-be-optimized parameter is updated by:

$$M_{I,i} = M_{I,i} - \alpha_{M_{I,i}} \frac{\partial L}{\partial M_{I,i}},$$

$$N_{I,i} = N_{I,i} - \alpha_{N_{I,i}} \frac{\partial L}{\partial N_{I,i}},$$

$$A1_{I,i} = A1_{I,i} - \alpha_{A1_{I,i}} \frac{\partial L}{\partial A1_{I,i}},$$

$$B1_{I,i} = B1_{I,i} - \alpha_{B1_{I,i}} \frac{\partial L}{\partial B1_{I,i}},$$

$$A2_{I,i} = A2_{I,i} - \alpha_{A2_{I,i}} \frac{\partial L}{\partial A2_{I,i}},$$

$$B2_{I,i} = B2_{I,i} - \alpha_{B2_{I,i}} \frac{\partial L}{\partial B2_{I,i}},$$

$$D_l = D_l - \alpha_{D_l} \frac{\partial L}{\partial D_l}, \text{ and}$$

$$C_{n,m} = C_{n,m} - \alpha_{C_{n,m}} \frac{\partial L}{\partial C_{n,m}},$$

where $\alpha_{M_{l,i}}$, $\alpha_{N_{l,i}}$, $\alpha_{A1_{l,i}}$, $\alpha_{B1_{l,i}}$, $a_{A2_{l,i}}$, $\alpha_{B2_{l,i}}$, $\alpha_{D_l}$ and $\alpha_{C_{n,m}}$ are learning rates of the parameters. An update process may be optimized using an Adam algorithm or other algorithms.

After optimization of each to-be-optimized parameter, the loss function is recalculated based on optimized parameters. An iteration is performed until the iteration termination condition is satisfied.

In an embodiment of the present disclosure, the iteration termination condition includes: a number of iterations reaching a predetermined threshold; and/or the loss function converging to a predetermined value.

Through the above iteration processes, the optimized sample transmission function and the optimized electron beam function are finally obtained. A plurality of sample-related parameters is obtained based on the optimized sample transmission function and the optimized electron beam function, including, but not limited to, e.g., the aberration coefficients, the atom positions, and the parameters describing the atomic spatial distribution. In this way, not only the two-dimensional image of the sample is obtained, but also the parameterized representation of information on the atom positions is realized.

The method for reconstructing the atomic spatial distribution and the electron beam function of the present disclosure is described in detail below with reference to the accompanying drawings and embodiments.

In an embodiment, it is a projection of strontium titanate along the direction [110] that needs to be observed, a structure of which is illustrated in FIG. 2. For conventional ptychographic imaging methods, only an amplitude image and a phase image of a transmission function of the strontium titanate in the direction [110] can be obtained, while precise atom positions and other information cannot be obtained.

The electron beam scans over the sample. Scanning points may be referred to FIG. 3. A detector collects diffraction intensity data at each scanning position to obtain 4D-STEM data. A diffraction pattern at the 1,000-th scanning position is illustrated in FIG. 4. A convergence semi-angle of 25 mrad and an underfocus of 6 nm were used.

Figure 5:
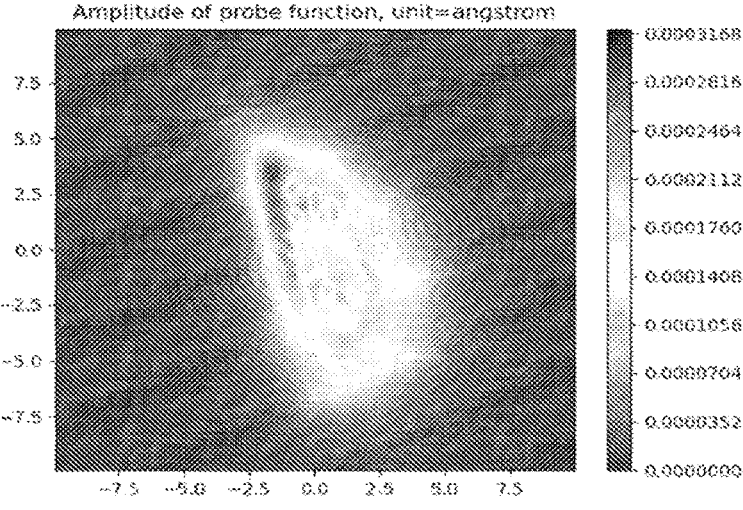
FIG. 5 is a schematic diagram showing an amplitude image of an electron beam function initialized by aberration coefficients according to an algorithm provided in an embodiment of the present disclosure.
Figure 6:
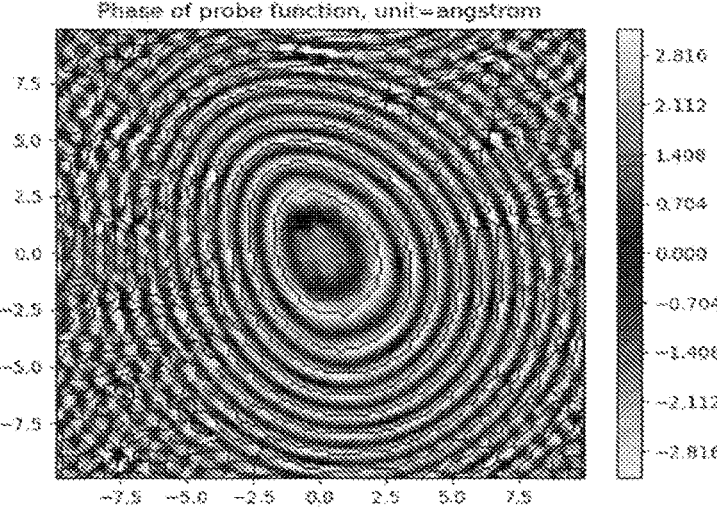
FIG. 6 is a schematic diagram showing a phase image of an electron beam function initialized by aberration coefficients according to an algorithm provide in an embodiment of the present disclosure.
Figure 7:
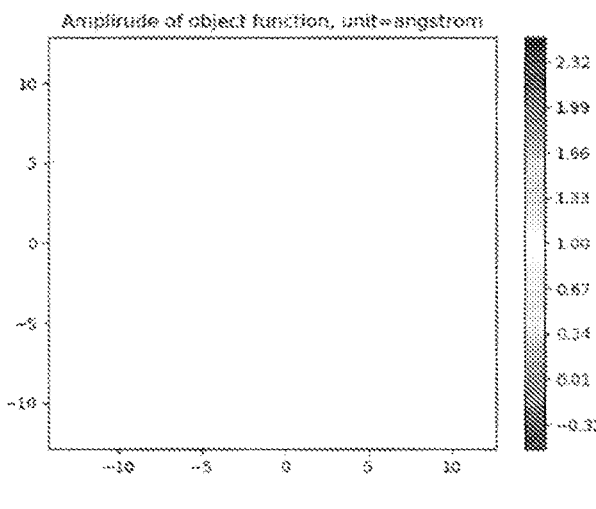
FIG. 7 is a schematic diagram showing an amplitude image of a transmission function initialized by Gaussian functions according to an algorithm provided in an embodiment of the present disclosure.
Figure 8:
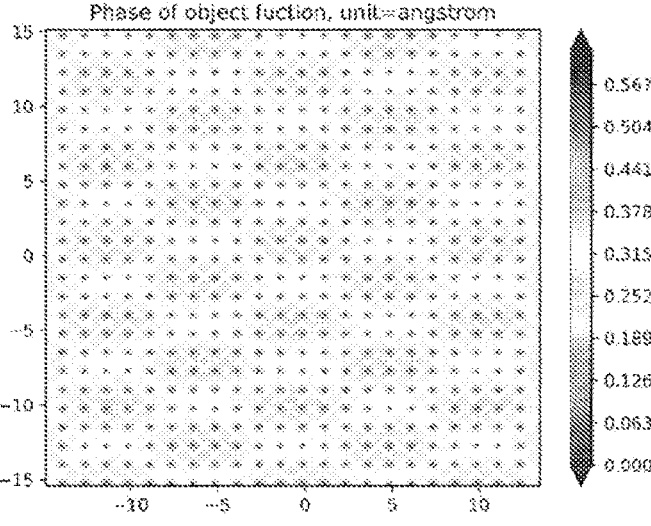
FIG. 8 is a schematic diagram showing a phase image of a transmission function initialized by Gaussian functions according to an algorithm provided in n embodiment of the present disclosure.
Figure 9:
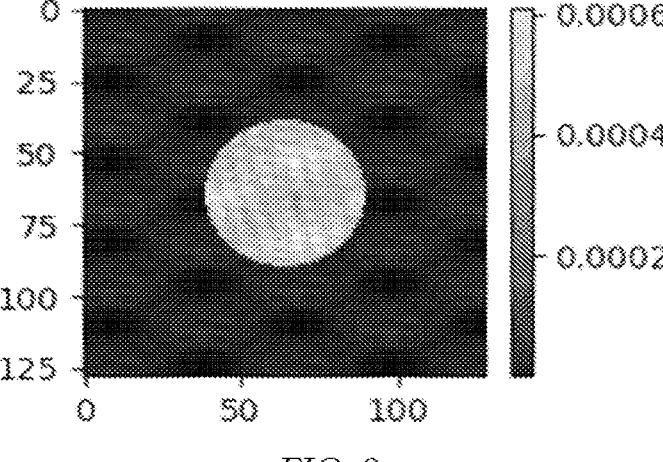
FIG. 9 is a schematic diagram showing a diffraction pattern at the 1,000-th scanning position obtained after initialization of a transmission function and an electron beam function by an algorithm provided in an embodiment of the present disclosure.

Each aberration coefficient was randomly initialized. The electron beam function was initialized using an equation $P(r) = \mathcal{F}\{A(k)e^{i\chi(k)}\}$. An amplitude of the initialized electron beam function is illustrated in FIG. 5 and a phase of the initialized electron beam function is illustrated in FIG. 6. The atom positions, the s-orbital pea height, the s-orbital peak width, the amplitude peak height, the amplitude peak width, and other parameters were initialized to obtain an amplitude of an initialized transmission function as illustrated in FIG. 7 and a phase of the initialized transmission function is as illustrated in FIG. 8. In this case, the diffraction pattern at the 1,000-th scanning position is as illustrated in FIG. 9.

The loss function $$\mathcal{L} = \frac{1}{2}\sum_j \sum_{u,v}\left(|\mathcal{F}\{\psi_{exit}\}|^2 - I_j\right)^2$$

is calculated. The gradients of the loss function $\mathcal{L}$ with respect to the to-be-optimized parameters are solved. Target parameters are iteratively updated using the following equations:

$$M_{l,i} = M_{l,i} - \alpha_{M_{l,i}}\frac{\partial L}{\partial M_{l,i}},$$

-continued $$N_{l,i} = N_{l,i} - \alpha_{N_{l,i}}\frac{\partial L}{\partial N_{l,i}},$$

$$A1_{l,i} = A1_{l,i} - \alpha_{A1_{l,i}}\frac{\partial L}{\partial A1_{l,i}},$$

$$B1_{l,i} = B1_{l,i} - \alpha_{B1_{l,i}}\frac{\partial L}{\partial B1_{l,i}},$$

$$A2_{l,i} = A2_{l,i} - \alpha_{A2_{l,i}}\frac{\partial L}{\partial A2_{l,i}},$$

$$B2_{l,i} = B2_{l,i} - \alpha_{B2_{l,i}}\frac{\partial L}{\partial B2_{l,i}},$$

$$D_l = D_l - \alpha_{D_l}\frac{\partial L}{\partial D_l}, \text{ and}$$

$$C_{n,m} = C_{n,m} - \alpha_{C_{n,m}}\frac{\partial L}{\partial C_{n,m}},$$

where $\alpha_{M_{l,i}}$, $\alpha_{N_{l,i}}$, $\alpha_{A1_{l,i}}$, $\alpha_{B1_{l,i}}$, $a_{A2_{l,i}}$, $\alpha_{B2_{l,i}}$, $\alpha_{D_l}$ and $\alpha_{C_{n,m}}$ are learning rates of the parameters. An update process may be optimized using an Adam algorithm or other algorithms.

Figures 10, 11:
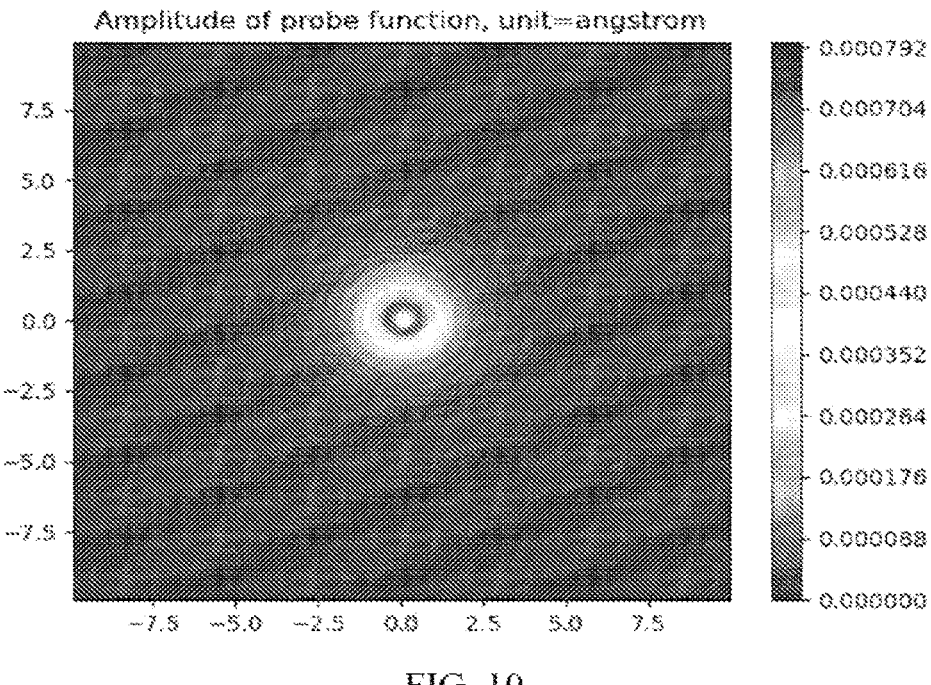
FIG. 10 is a schematic diagram showing an amplitude image of a reconstructed electron beam function according to an algorithm provided in an embodiment of the present disclosure.
FIG. 11 is a schematic diagram showing a phase image of a reconstructed electron beam function according to an algorithm provided in an embodiment of the present disclosure.
Figure 12:
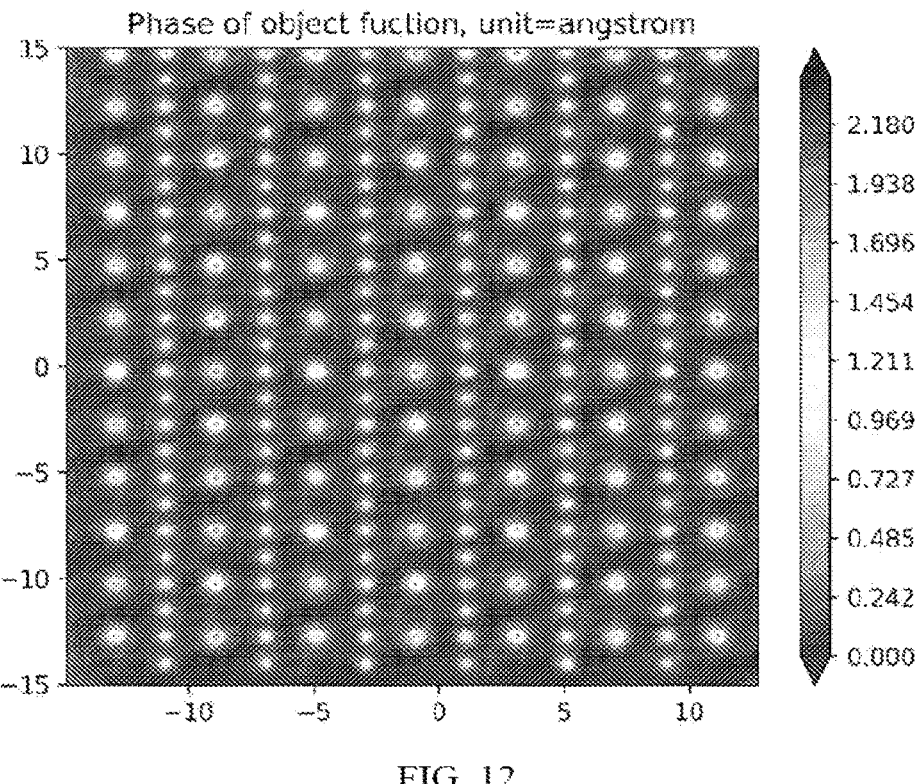
FIG. 12 is a schematic diagram showing a phase image of a reconstructed transmission function according to an algorithm provided in an embodiment of the present disclosure.
Figure 13:
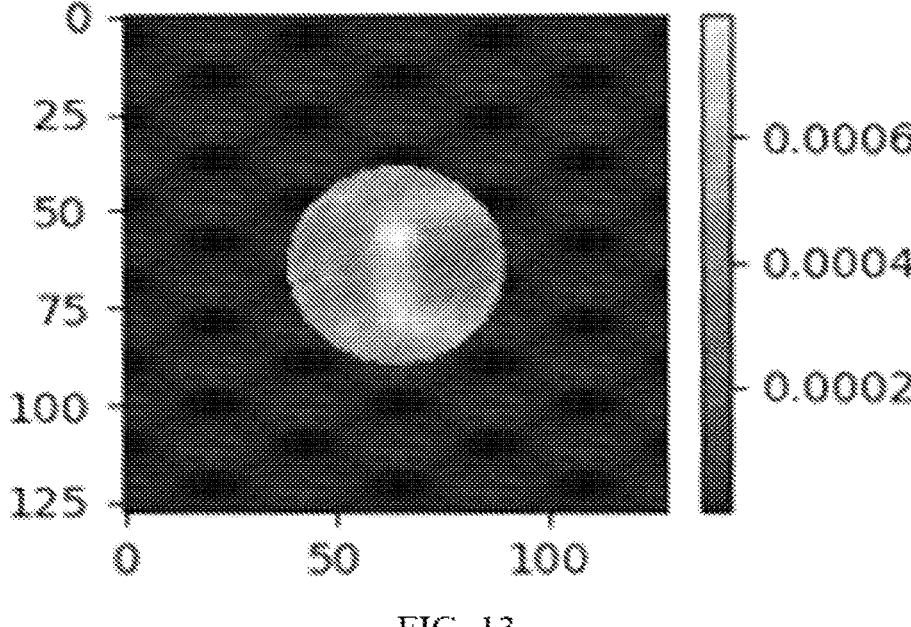
FIG. 13 is a schematic diagram showing a diffraction pattern at the 1,000-th scanning position obtained after reconstruction of a transmission function and an electron beam function by an algorithm provided in an embodiment of the present disclosure.
Figure 14:
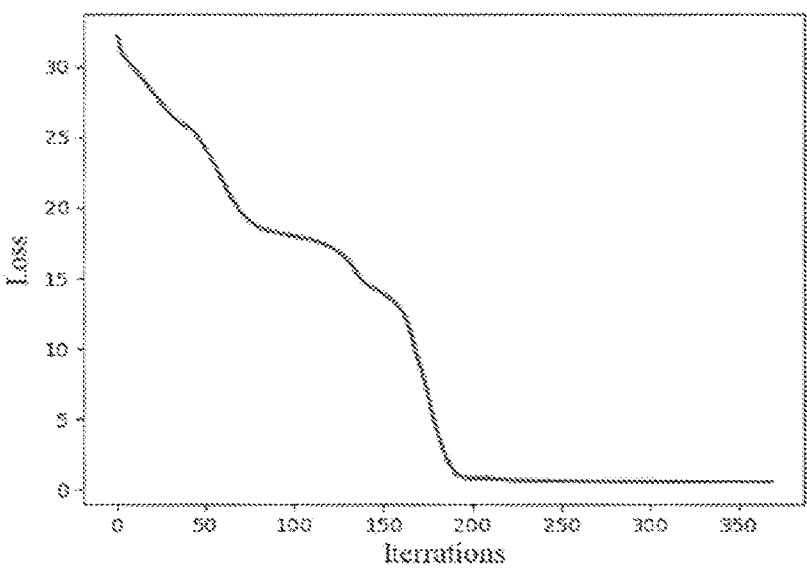
FIG. 14 is a schematic diagram showing a variation curve of a Loss function in an iteration process of an algorithm provided in an embodiment of the present disclosure.

An amplitude image of a reconstructed electron beam function finally obtained is as illustrated in FIG. 10. A phase image of the reconstructed electron beam function is as illustrated in FIG. 11. A phase image of a reconstructed transmission function is as illustrated in FIG. 12. A diffraction pattern at the 1,000-th scanning position is as illustrated in FIG. 13. A variation curve of the Loss function in an iteration process of an algorithm is as illustrated in FIG. 14.

With the method for reconstructing the atomic spatial distribution and the electron beam function according to the embodiments of the present disclosure, a series of diffraction patterns obtained by the electron beam scanning over the sample are used as data. The transmission function of atoms in the sample is described in terms of a function including, but not limited to, the local functions of the atomic spatial distribution. The electron beam function is described in terms of a function including, but not limited to, the aberration functions corresponding to the aberration coefficients. In an iterative optimization algorithm of the ptychographic imaging, the parameters of the transmission function are updated by using the gradients of the loss function with respect to the parameters of the transmission function, and the parameters of the electron beam function are updated by using the gradients of the loss function with respect to the parameters of the electron bear function. Finally, the transmission function and the electron beam function are obtained. The present disclosure can directly obtain information such as coordinates of atoms in the sample and the atomic spatial distribution, and greatly reduce the number of to-be-optimized parameters in an optimization algorithm for the ptychographic imaging.

An apparatus for reconstructing an atomic spatial distribution and an electron beam function according to embodiments of the present disclosure is described with reference to the accompanying drawings.

Figure 15:
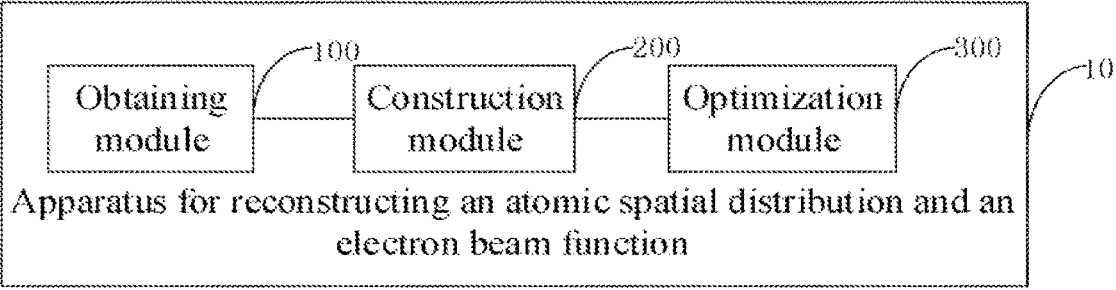
FIG. 15 is an example diagram of an apparatus for reconstructing an atomic spatial distribution and an electron beam function according to an embodiment of the present disclosure.

FIG. 15 is a block diagram showing an apparatus for reconstructing an atomic spatial distribution and an electron beam function according to an embodiment of the present disclosure.

As illustrated in FIG. 15, an apparatus 10 for reconstructing an atomic spatial distribution and an electron beam function includes an obtaining module 100, a construction module 200, and an optimization module 300.

The obtaining module 100 is configured to obtain, by controlling to move an electron beam to scan a sample, a diffraction intensity of the sample at each scanning position. The construction module 200 is configured to construct a sample transmission function and an electron beam function, establish, based on the diffraction intensity, the sample transmission function, and the electron beam function, a forward propagation model containing to-be-optimized parameters, and calculate a value of a loss function. The optimization module 300 is configured to solve a derivative of the loss function with respect to the to-be-optimized parameters, to obtain gradients of the to-be-optimized parameters in the sample transmission function and the electron beam function, optimize the to-be-optimized parameters based on the gradients, update the value of the loss function, repeat an iteration process until an iteration termination condition is satisfied, and output an optimized sample transmission function and an optimized electron beam function.

Optionally, in an embodiment of the present disclosure, the action of constructing the sample transmission function and the electron beam function includes: describing the sample transmission function using local functions for the atomic spatial distribution; and describing the electron beam function using aberration functions.

Optionally, in an embodiment of the present disclosure, the apparatus further includes: an initialization module configured to, prior to constructing the sample transmission function and the electron beam function, initialize the to-be-optimized parameters in the sample transmission function and the electron beam function. The to-be-optimized parameters in the electron beam function includes aberration coefficients. The to-be-optimized parameters in the sample transmission function include atom positions and parameters describing the atomic spatial distribution.

Optionally, in an embodiment of the present disclosure, the loss function is:

$$\mathcal{L} = \frac{1}{2}\sum_{j}\sum_{u,v}\left(|\mathcal{F}\{\psi_{exit}\}|^2 - I_j\right)^2,$$

where j represents an ordinal number of the scanning position, u, v represents coordinates in real space, |•| represents calculating a modulus of each element in a matrix, $\mathcal{F}\{•\}$ represents calculating a two-dimensional Fourier transform of a matrix, $I_j$ represents the diffraction intensity, and $\psi_{exit}$ represents an exit wave function;

the exit wave function $\psi_{exit}$ is:

$$\psi_{exit} = \mathcal{P}_{dz}\{\ldots \mathcal{P}_{dz}\{\mathcal{P}_{dz}\{P(r-r_j)O_1(r)\}O_2(r)\}O_3(r)\ldots \}O_l(r),$$

where P(r) represents the electron beam function, $P(r-r_j)$ represents the electron beam scanning to a j-th position, $\mathcal{P}_{dz}\{•\}$ represents a Fresnel diffraction propagator, and $O_l(r)$ represents the sample transmission function of the l-th slice;

the sample transmission function $O_l(r)$ is:

$$O_l(r) = Amp_l(r) * e^{i\sigma V_l(r)},$$

where $V_l(r)$ represents a projection potential of the transmission function, $Amp_l(r)$ represents an amplitude of the transmission function, $$V_l(r) = s_l(r) + p_l(r) + d_l(r) + f_l(r) + \cdots, \text{ and}$$

$$Amp_l(r) = \sum_i A2_{l,i} * \exp\left\{-\frac{[(M_{l,i}-y)^2 + (N_{l,i}-x)^2]}{B2_{l,i}}\right\} + D_l,$$

where s(r) represents an s-orbital spatial distribution of electrons in the l-th slice, p(r) represents a p-orbital spatial distribution of electrons in the l-th slice, and $s_l(r)$ is represented by a local function of a Gaussian function as:

$$s_l(r) = \sum_i A1_{l,i} * \exp\left\{-\frac{[(M_{l,i}-y)^2 + (N_{l,i}-x)^2]}{B1_{l,i}}\right\};$$

and
the electron beam function P(r) is:

$$P(r) = \mathcal{F}\{A(k)e^{i\chi(k)}\},$$

$$\chi(k) = R\left\{\frac{1}{2}\omega\bar{\omega}C_{1,0} + \frac{1}{2}\bar{\omega}^2C_{1,2} + \omega^2\bar{\omega}^2C_{2,1} + \frac{1}{4}\omega^2\bar{\omega}^2C_{3,0} + \ldots \right\},$$

where A(k) represents a diaphragm function, $C_{n,m}$ represents a aberration coefficient, $\chi(k)$ represents an aberration function, R{•} represents taking a real part of a matrix in {•}, aberration $\omega = k_x + i*k_y$, $k_x$ and $k_y$ are coordinates in reciprocal space, respectively, and $\bar{\omega}$ is the complex conjugate matrix of $\omega$.

Optionally, in an embodiment of the present disclosure, the iteration termination condition includes: a number of iterations reaching a predetermined threshold; and/or the loss function converging to a predetermined value.

It should be noted that the above explanation of the embodiments of the method for reconstructing the atomic spatial distribution and the electron beam function is also applicable to the apparatus for reconstructing the atomic spatial distribution and the electron beam function according to this embodiment, and thus details thereof will be omitted here.

With the apparatus for reconstructing the atomic spatial distribution and the electron beam function according to this embodiment, the electron beam function is not limited to being represented by aberration functions corresponding to aberration coefficients, and the transmission function is not limited to being represented in the parametrical form of the local functions of the atomic spatial distribution, allowing resolution with sub-pixel precision to be achieved. In addition, the information on the atom positions and the atomic spatial distribution is represented parametrically while advantages of conventional ptychographic imaging are retained, allowing a further analysis to be facilitated.

Figure 16:
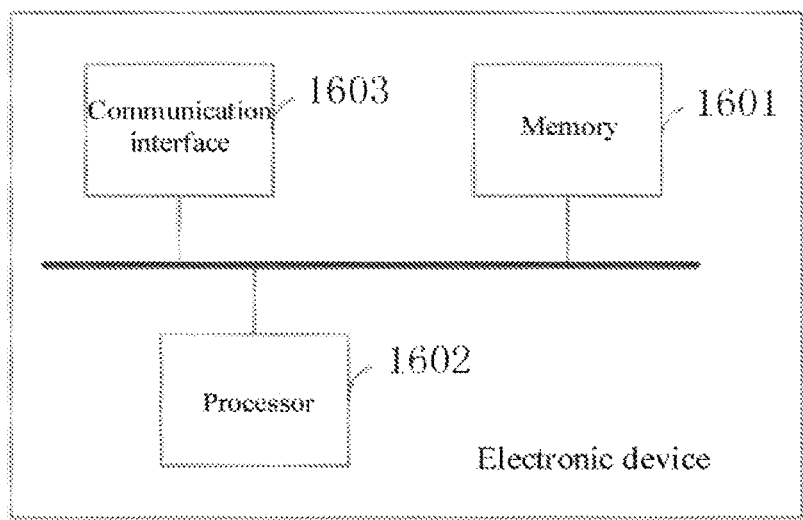
FIG. 16 is a schematic diagram showing a structure of an electronic device according to an embodiment of the present disclosure.

FIG. 16 is a schematic diagram showing a structure of an electronic device according to an embodiment of the present disclosure. The electronic device may include a memory 1601, a processor 1602, and a computer program stored in the memory 1601 and executable on the processor 1602. The processor 1602, when executing the computer program, implements the method for reconstructing the atomic spatial distribution and the electron beam function according to any of the above embodiments.

Further, the electronic device includes: a communication interface 1603 configured to communicate between the memory 1601 and the processor 1602; and the memory 1601 storing a computer program executable on the processor 1602. The memory 1601 may include a high-speed Random Access Memory (RAM), and may also include a non-volatile memory, such as at least one disk memory.

When the memory 1601, the processor 1602, and the communication interface 1603 are implemented independently, the communication interface 1603, the memory 1601, and the processor 1602 may be interconnected and communicate with each other via a bus. The bus may be an Industry Standard Architecture (ISA) bus, a Peripheral Component (PCI) bus, or an Extended Industry Standard Architecture (EISA) bus. The buses may be divided into an address bus, a data bus, a control bus, etc. For the convenience of description, only one thick line is used in FIG. 16, but it does not mean that there is only one bus or one type of bus.

Optionally, in a specific implementation, when the memo 1601, the processor 1602, and the communication interface 1603 are integrated on a single chip for an implementation, the memory 1601, the processor 1602, and the communication interface 1603 may communicate with each other through an internal interface.

The processor 1602 may be a Central Processing Unit (CPU), or an Application Specific Integrated Circuit (ASIC), or one or more integrated circuits configured to implement an embodiment of the present disclosure.

A computer-readable storage medium is further provided according to an embodiment. The computer-readable storage medium stores a computer program. The computer program, when executed by a processor, implements the method for reconstructing the atomic spatial distribution and the electron beam function as described above.

In the description of this specification, descriptions with reference to the terms "an embodiment", "some embodiments", "examples", "specific examples", or "some examples" etc., mean that specific features, structure, materials or characteristics described in conjunction with the embodiment or example are included in at least one embodiment or example of the present disclosure. In this specification, the schematic representations of the above terms do not necessarily refer to the same embodiment or example. Moreover, the described specific features, structures, materials or characteristics may be combined in any one or more embodiments or examples in a suitable manner. In addition, those skilled in the art can combine the different embodiments or examples and the features of the different embodiments or examples described in this specification without contradicting each other.

In addition, the terms "first" and "second" are only used for descriptive purposes, and cannot be understood as indicating or implying relative importance or implicitly indicating the number of indicated technical features. Therefore, the features defined with "first" and "second" may explicitly or implicitly include at least one of the features. In the description of the present disclosure, "N" means at least two, such as two, three, etc., unless otherwise specifically defined.

Any process or method described in a flowchart or described herein in other ways may be understood to include one or N modules, segments, or portions of codes of executable instructions for achieving specific logical functions or steps in the process. The scope of a preferred embodiment of the present disclosure includes other implementations. A function may be performed not in a sequence shown or discussed, including a substantially simultaneous manner or a reverse sequence based on the function involved, which should be understood by those skilled in the art to which the embodiments of tie present disclosure belong.

It should be understood that each part of the present disclosure may be realized by hardware, software, firmware, or a combination thereof. In the above embodiments, N steps or methods may be realized by software or firmware stored in the memory and executed by an appropriate instruction execution system. For example, when it is realized by the hardware, likewise in another embodiment, the steps or methods may be realized by one or a combination of the following techniques known in the art: a discrete logic circuit having a logic gate circuit for realizing a logic function of a data signal, n application-specific integrated circuit having an appropriate combination logic gate circuit, a Programmable Gate Array (PGA), a Field Programmable Gate Array (FPGA), etc.

It should be understood by those skilled in the art that all or a part of the steps carried by the method in the above-described embodiments may be completed by relevant hardware instructed by a program. The program may be stored in a computer-readable storage medium. When the program is executed, one or a combination of the steps of the method in the above-described embodiments may be included.

What is claimed is:

1. A method for reconstructing an atomic spatial distribution and an electron beam function, comprising:

S101, obtaining, by controlling to move an electron beam to scan a sample, a diffraction intensity of the sample at each scanning position;

S102, describing a sample transmission function using local functions for the atomic spatial distribution, describing an electron beam function using aberration functions, establishing, based on the diffraction intensity, the sample transmission function, and the electron beam function, a forward propagation model containing to-be-optimized parameters, and calculating a value of a loss function;

S103, solving a derivative of the loss function with respect to the to-be-optimized parameters, to obtain gradients of the to-be-optimized parameters in the sample transmission function and the electron beam function, optimizing the to-be-optimized parameters based on the gradients, and updating the value of the loss function; and S104, determining whether a current iteration satisfies an iteration termination condition, performing S103 in response to the current iteration failing to satisfy the iteration termination condition, and outputting, in response to the current iteration satisfying the iteration termination condition, an optimized sample transmission function and an optimized electron beam function, wherein the loss function is:

$$\mathcal{L} = \frac{1}{2}\sum_{j}\sum_{u,v}\left(|\mathcal{F}\{\psi_{exit}\}|^2 - I_j\right)^2$$

where $j$ represents an ordinal number of the scanning position, $u$, $v$ represents coordinates in real space, $|\cdot|$ represents calculating a modulus of each element in a matrix, $\mathcal{F}\{\cdot\}$ represents calculating a two-dimensional Fourier transform of a matrix, $I_i$ represents the diffraction intensity, and $\psi_{exit}$ represents an exit wave function;

the exit wave function $\psi_{exit}$ is:

$$\psi_{exit} = \mathcal{P}_{dz}\{\ldots \; \mathcal{P}_{dz}\{\mathcal{P}_{dz}\{P(r - r_j)O_1(r)\}O_2(r)\}O_3(r)\ldots \;\}O_1(r),$$

where $P(r)$ represents the electron beam function, $P(r-r_i)$ represents the electron beam scanning to a i-th position, $\underline{\mathcal{P}}_{dz}\{\bullet\}$ represents a Fresnel diffraction propagator, and $O_l(r)$ represents the sample transmission function of the l-th slice;

the sample transmission function $O_l(r)$ is:

$$O_l(r) = Amp_1(r) * e^{i\sigma V_l(r)},$$

where $V_l(r)$ represents a projection potential of the transmission function, $Amp_l(r)$ represents an amplitude of the transmission function, $$V_l(r) = s_l(r) + p_l(r) + d_l(r) + f_l(r) + \ldots \; , \text{ and}$$

$$Amp_l(r) = \sum_i A2_{l,i} * \exp\left\{-\frac{[(M_{l,i} - y)^2 + (N_{l,i} - x)^2]}{B2_{l,i}}\right\} + D_l,$$

where $s(r)$ represents an s-orbital spatial distribution of electrons in the l-th slice, $p(r)$ represents a p-orbital spatial distribution of electrons in the l-th slice, and $s_l(r)$ is represented by a local function of a Gaussian function as:

$$s_l(r) = \sum_i A1_{l,i} * \exp\left\{-\frac{[(M_{l,i} - y)^2 + (N_{l,i} - x)^2]}{B1_{l,i}}\right\};$$

and the electron beam function $P(r)$ is:

$$P(r) = \mathcal{F}\{A(k)e^{i\chi(k)}\},$$

$$\chi(k) = R\left\{\frac{1}{2}\omega\bar{\omega}C_{1,0} + \frac{1}{2}\bar{\omega}^2 C_{1,2} + \omega^2\bar{\omega}^2 C_{2,1} + \frac{1}{4}\omega^2\bar{\omega}^2 C_{3,0} + \ldots \;\right\},$$

where $A(k)$ represents a diaphragm function, $C_{n,m}$ represents an aberration coefficient, $\chi(k)$ represents an aberration function, $R\{\bullet\}$ represents taking a real part of a matrix in $\{\bullet\}$, aberration $\omega = k_x + i*k_y$, $k_x$ and $k_y$ are coordinates in reciprocal space, respectively, and $\bar{\omega}$ is the complex conjugate matrix of $\omega$, wherein $d_l(r)$ is the d-orbital spatial distribution of electrons in the l-th slice, $M_{l,i}$ and $N_{l,i}$ are the center coordinates of the i-th local function, A1 is the peak value of an s-orbital spatial distribution, A2 is a the peak value of the transmission function amplitude, B1/B2 are a spatial distribution range of the atomic spatial distribution, and a is an constant that scales the effect of the potential $V_l(r)$ on the phase of the electron wave.

2. The method according to claim 1, further comprising, prior to said describing the sample transmission function using the local functions for the atomic spatial distribution, and describing the electron beam function using the aberration functions:

initializing the to-be-optimized parameters in the sample transmission function and the electron beam function, wherein the to-be-optimized parameters in the electron beam function comprises aberration coefficients, and wherein the to-be-optimized parameters in the sample transmission function comprises atom positions and parameters describing the atomic spatial distribution.

3. The method according to claim 1, wherein the iteration termination condition comprises at least one of a number of iterations reaching a predetermined threshold; or the loss function converging to a predetermined value.

4. A non-transitory computer-readable storage medium, having a computer program stored thereon, wherein the computer program, when executed by a processor, implements the method for reconstructing the atomic spatial distribution and the electron beam function according to claim 1.

5. The non-transitory computer-readable storage medium according to claim 4, wherein the method further comprises, prior to said describing the sample transmission function using the local functions for the atomic spatial distribution, and describing the electron beam function using the aberration functions:

initializing the to-be-optimized parameters in the sample transmission function and the electron beam function, wherein the to-be-optimized parameters in the electron beam function comprise aberration coefficients, and wherein the to-be-optimized parameters in the sample transmission function comprise atom positions and parameters describing the atomic spatial distribution.

6. The non-transitory computer-readable storage medium according to claim 4, wherein the iteration termination condition comprises at least one of a number of iterations reaching a predetermined threshold; or the loss function converging to a predetermined value.

7. An apparatus for reconstructing an atomic spatial distribution and an electron beam function, comprising:

an obtaining module configured to obtain, by controlling to move an electron beam to scan a sample, a diffraction intensity of the sample at each scanning position;

a construction module configured to describe a sample transmission function using local functions for the atomic spatial distribution, describe an electron beam function using aberration functions, establish, based on the diffraction intensity, the sample transmission function, and the electron beam function, a forward propagation model containing to-be-optimized parameters, and calculate a value of a loss function; and an optimization module configured to solve a derivative of the loss function with respect to the to-be-optimized parameters, to obtain gradients of the to-be-optimized parameters in the sample transmission function and the electron beam function, optimize the to-be-optimized parameters based on the gradients, update the value of the loss function, repeat an iteration process until an iteration termination condition is satisfied, and output an optimized sample transmission function and an optimized electron beam function, wherein the loss function is:

$$\mathcal{L} = \frac{1}{2}\sum_j\sum_{u,v}(|\mathcal{F}\{\psi_{exit}\}|^2 - I_j)^2,$$

where j represents an ordinal number of the scanning position, u, v represents coordinates in real space, $|\bullet|$ represents calculating a modulus of each element in a matrix, $\underline{\mathcal{F}}\{\bullet\}$ represents calculating a two-dimensional Fourier transform of a matrix, $I_j$ represents the diffraction intensity, and $\psi_{exit}$ represents an exit wave function;

the exit wave function $\psi_{exit}$ is:

$$\psi_{exit} = \mathcal{P}_{dz}\{\ldots \; \mathcal{P}_{dz}\{\mathcal{P}_{dz}\{P(r-r_j)O_1(r)\}O_2(r)\}O_3(r)\ldots \; \}O_l(r),$$

where $P(r)$ represents the electron beam function, $P(r-r_j)$ represents the electron beam scanning to a j-th position, $\underline{\mathcal{P}}_{dz}\{\bullet\}$ represents a Fresnel diffraction propagator, and $O_l(r)$ represents the sample transmission function of the l-th slice;

the sample transmission function $O_l(r)$ is:

$$O_l(r) = \mathrm{Amp}_l(r) * e^{i\sigma V_l(r)},$$

where $V_l(r)$ represents a projection potential of the transmission function, $\mathrm{Amp}_l(r)$ represents an amplitude of the transmission function, $$V_l(r) = s_l(r) + p_l(r) + d_l(r) + f_l(r) + \ldots \; , \text{ and}$$

$$Amp_l(r) = \sum_i A2_{l,i} * \exp\left\{-\frac{\left[(M_{l,i} - y)^2 + (N_{l,i} - x)^2\right]}{B2_{l,i}}\right\} + D_l,$$

where $s(r)$ represents an s-orbital spatial distribution of electrons in the l-th slice, $p(r)$ represents a p-orbital spatial distribution of electrons in the l-th slice, and $s_l(r)$ is represented by a local function of a Gaussian function as:

$$s_l(r) = \sum_i A1_{l,i} * \exp\left\{-\frac{\left[(M_{l,i} - y)^2 + (N_{l,i} - x)^2\right]}{B1_{l,i}}\right\}; \text{ and}$$

the electron beam function $P(r)$ is:

$$P(r) = \mathcal{F}\{A(k)e^{i\chi(k)}\},$$

$$\chi(k) = R\left\{\frac{1}{2}\omega\bar{\omega}C_{1,0} + \frac{1}{2}\bar{\omega}^2 C_{1,2} + \omega^2\bar{\omega}^2 C_{2,1} + \frac{1}{4}\omega^2\bar{\omega}^2 C_{3,0} + \ldots \; \right\},$$

where $A(k)$ represents a diaphragm function, $C_{n,m}$ represents an aberration coefficient, $\chi(k)$ represents an aberration function, $R\{\bullet\}$ represents taking a real part of a matrix in $\{\bullet\}$, aberration $\omega=k_x+i*k_y$, $k_x$ and $k_y$ are coordinates in reciprocal space, respectively, and $\bar{\omega}$ is the complex conjugate matrix of $\omega$, wherein $d_l(r)$ is the d-orbital spatial distribution of electrons in the l-th slice, $M_{l,i}$ and $N_{l,i}$ are the center coordinates of the i-th local function, A1 is the peak value of an s-orbital spatial distribution, A2 is a the peak value of the transmission function amplitude, B1/B2 are a spatial distribution range of the atomic spatial distribution, and a is an constant that scales the effect of the potential $V_l(r)$ on the phase of the electron wave.

8. The apparatus according to claim 7, further comprising:
an initialization module configured to, prior to describing the sample transmission function using the local functions for the atomic spatial distribution, and describing the electron beam function using the aberration functions, initialize the to-be-optimized parameters in the sample transmission function and the electron beam function, wherein the to-be-optimized parameters in the electron beam function comprises aberration coefficients, and wherein the to-be-optimized parameters in the sample transmission function comprises atom positions and parameters describing the atomic spatial distribution.

9. The apparatus according to claim 7, wherein the iteration termination condition comprises at least one of: a number of iterations reaching a predetermined threshold; or the loss function converging to a predetermined value.

10. An electronic device, comprising
a memory;
a processor; and
a computer program stored in the memory and executable on the processor,
wherein the processor, when executing the computer program, implements:
S101, obtaining, by controlling to move an electron beam to scan a sample, a diffraction intensity of the sample at each scanning position;
S102, describing a sample transmission function using local functions for the atomic spatial distribution, describing an electron beam function using aberration functions, based on the diffraction intensity, the sample transmission function, and the electron beam function, a forward propagation model containing a to-be-optimized parameter, and calculating a value of a loss function;
S103, solving a derivative of the loss function with respect to the to-be-optimized parameters, to obtain gradients of the to-be-optimized parameters in the sample transmission function and the electron beam function, optimizing the to-be-optimized parameters based on the gradients, and updating the value of the loss function; and
S104, determining whether a current iteration satisfies an iteration termination condition, performing S103 in response to the current iteration failing to satisfy the iteration termination condition, and outputting, in response to the current iteration satisfying the iteration termination condition, an optimized sample transmission function and an optimized electron beam function, wherein the loss function is:

$$\mathcal{L} = \frac{1}{2}\sum_j \sum_{u,v} \left(|\mathcal{F}\{\psi_{exit}\}|^2 - I_j\right)^2,$$

where j represents an ordinal number of the scanning position, u, v represents coordinates in real space, $|\bullet|$ represents calculating a modulus of each element in a matrix, $\mathcal{F}\{\bullet\}$ represents calculating a two-dimensional Fourier transform of a matrix, $I_j$ represents the diffraction intensity, and $\psi_{exit}$ represents an exit wave function;

the exit wave function $\psi_{exit}$ is:

$$\psi_{exit} = \mathcal{P}_{dz}\{\dots \ \mathcal{P}_{dz}\{\mathcal{P}_{dz}\{P(r-r_j)O_1(r)\}O_2(r)\}O_3(r)\dots \ \}O_l(r),$$

where P(r) represents the electron beam function, P(r–r_j) represents the electron beam scanning to a j-th position, $\mathcal{P}_{dz}\{\bullet\}$ represents a Fresnel diffraction propagator, and $O_l(r)$ represents the sample transmission function of the l-th slice;

the sample transmission function $O_l(r)$ is:

$$O_l(r) = \text{Amp}_l(r) * e^{i\sigma V_l(r)},$$

where $V_l(r)$ represents a projection potential of the transmission function, $\text{Amp}_l(r)$ represents an amplitude of the transmission function, $$V_l(r) = s_l(r) + p_l(r) + d_l(r) + f_l(r) + \dots, \text{ and}$$

$$\text{Amp}_l(r) = \sum_i A2_{l,i} * \exp\left\{-\frac{\left[(M_{l,i}-y)^2 + (N_{l,i}-x)^2\right]}{B2_{l,i}}\right\} + D_l,$$

where s(r) represents an s-orbital spatial distribution of electrons in the l-th slice, p(r) represents a p-orbital spatial distribution of electrons in the l-th slice, and $s_l(r)$ is represented by a local function of a Gaussian function as:

$$s_l(r) = \sum_i A1_{l,i} * \exp\left\{-\frac{\left[(M_{l,i}-y)^2 + (N_{l,i}-x)^2\right]}{B1_{l,i}}\right\};$$

and the electron beam function P(r) is:

$$P(r) = \mathcal{F}\{A(k)e^{j\chi(k)}\},$$

$$\chi(k) = R\left\{\frac{1}{2}\omega\bar{\omega}C_{1,0} + \frac{1}{2}\bar{\omega}^2 C_{1,2} + \omega^2\bar{\omega}^2 C_{2,1} + \frac{1}{4}\omega^2\bar{\omega}^2 C_{3,0} + \dots \right\},$$

where A(k) represents a diaphragm function, $C_{n,m}$ represents an aberration coefficient, $\chi(k)$ represents an aberration function, $R\{\bullet\}$ represents taking a real part of a matrix in $\{\bullet\}$, aberration $\omega = k_x + i*k_y$, $k_x$ and $k_y$ are coordinates in reciprocal space, respectively, and $\bar{\omega}$ is the complex conjugate matrix of $\omega$, wherein $d_l(r)$ is the d-orbital spatial distribution of electrons in the l-th slice, $M_{l,i}$ and $N_{l,i}$ are the center coordinates of the i-th local function, A1 is the peak value of an s-orbital spatial distribution, A2 is a the peak value of the transmission function amplitude, B1/B2 are a spatial distribution range of the atomic spatial distribution, and a is an constant that scales the effect of the potential $V_l(r)$ on the phase of the electron wave.

11. The electronic device according to claim 10, wherein the processor, when executing the computer program, further implements, prior to said describing the sample transmission function using the local functions for the atomic spatial distribution, and describing the electron beam function using the aberration functions:

initializing the to-be-optimized parameters in the sample transmission function and the electron beam function, wherein the to-be-optimized parameters in the electron beam function comprises aberration coefficients, and wherein the to-be-optimized parameters in the sample transmission function comprises atom positions and parameters describing the atomic spatial distribution.

12. The electronic device according to claim 10, wherein the iteration termination condition comprises at least one of a number of iterations reaching a predetermined threshold; or the loss function converging to a predetermined value.

\* \* \* \* \*